United States Patent
Engelbart et al.

(10) Patent No.: US 10,843,821 B2
(45) Date of Patent: *Nov. 24, 2020

(54) PREDICTIVE PREPARATION OF MATERIAL FOR JOINT ASSEMBLY

(71) Applicant: The Boeing Company, Chicago, IL (US)

(72) Inventors: Roger W. Engelbart, St. Louis, MO (US); John William Adams, North Charleston, SC (US); James C. Kennedy, Summerville, SC (US)

(73) Assignee: The Boeing Company, Chicago, IL (US)

( * ) Notice: Subject to any disclaimer, the term of this patent is extended or adjusted under 35 U.S.C. 154(b) by 22 days.

This patent is subject to a terminal disclaimer.

(21) Appl. No.: 16/239,497

(22) Filed: Jan. 3, 2019

(65) Prior Publication Data

US 2020/0216198 A1 Jul. 9, 2020

(51) Int. Cl.
*B64F 5/60* (2017.01)
*G05B 19/4099* (2006.01)
(Continued)

(52) U.S. Cl.
CPC .................. *B64F 5/60* (2017.01); *B64C 1/12* (2013.01); *B64F 5/10* (2017.01); *G05B 19/4099* (2013.01);
(Continued)

(58) Field of Classification Search
CPC ........... B29C 64/386; B29L 2031/3076; B33Y 10/00; B33Y 50/02; B33Y 80/00;
(Continued)

(56) References Cited

U.S. PATENT DOCUMENTS

| 4,848,137 A | 7/1989 | Turner et al. |
| 6,618,505 B2 | 9/2003 | Cork et al. |

(Continued)

FOREIGN PATENT DOCUMENTS

| WO | 0166414 A1 | 9/2001 |
| WO | 2014186089 A1 | 11/2014 |

OTHER PUBLICATIONS

Dalin et al, "Measurement of theThickness of U-30MES-5NT and VGM-L Sealing Compound Layers in Aircraft Products Using the Ultrasonic Nondestructive Testing Method", Polymer Science, Series D. Glues and Sealing Materials, 2012, vol. 5, No. 4, pp. 305-308.
(Continued)

*Primary Examiner* — Crystal J Barnes-Bullock
(74) *Attorney, Agent, or Firm* — Kolisch Hartwell, P.C.

(57) ABSTRACT

A method and system may be provided for determining a set of parameters for preparing a skin for assembly to a substructure. The skin may be nondestructively inspected to gather a data set relating to the skin thickness. Sets of as-built thickness values for the skin and of deviations from a nominal map of the skin thickness may be calculated. A mating area for the skin and substructure and a set of one or more locations for fastener holes in the mating area may be determined. A set of parameters for the one or more fastener holes and a set of one or more fastener lengths may be generated using the deviations. A tool may cut the one or more fastener holes using the set of parameters and the skin and substructure may be fastened using fasteners selected according to the generated set of one or more fastener lengths. The system may be used with a numerically-controlled machine, a nondestructive inspection system, and may include a computer coupled to the nondestructive inspection system for calculating the parameters for preparing the holes and the lengths of the one or more fasteners.

20 Claims, 7 Drawing Sheets

(51) Int. Cl.
  *B64F 5/10* (2017.01)
  *B64C 1/12* (2006.01)
  *G06F 30/17* (2020.01)
  *G06F 30/15* (2020.01)
  *B29L 31/30* (2006.01)

(52) U.S. Cl.
  CPC .............. *G06F 30/15* (2020.01); *G06F 30/17* (2020.01); *B29L 2031/3076* (2013.01)

(58) Field of Classification Search
  CPC ...... B64C 1/12; B64F 5/00; B64F 5/10; B64F 5/60; G05B 19/4099; G06F 30/15; G06F 30/17; G06F 2113/10; G06F 2113/24; G06F 2113/26; G06F 2113/28; Y10T 29/49735; Y10T 29/49764; Y10T 29/49778; Y10T 29/4978
  See application file for complete search history.

(56) References Cited

U.S. PATENT DOCUMENTS

| | | | |
|---|---|---|---|
| 7,141,191 B2 | 11/2006 | Engwall et al. | |
| 7,626,692 B2 | 12/2009 | Engelbart et al. | |
| 7,730,789 B2 | 6/2010 | Odendahl | |
| 7,887,729 B2* | 2/2011 | Tye | A63H 9/00 264/219 |
| 8,094,921 B2 | 1/2012 | Engelbart et al. | |
| 8,209,838 B2* | 7/2012 | Lindgren | G06F 30/15 29/402.12 |
| 8,583,271 B2 | 11/2013 | Engelbart et al. | |
| 8,687,872 B2 | 4/2014 | Engelbart et al. | |
| 8,756,792 B2 | 6/2014 | Boyl-Davis et al. | |
| 8,813,382 B1 | 8/2014 | Buttrick | |
| 9,038,470 B1 | 5/2015 | Engelbart et al. | |
| 9,068,809 B1 | 6/2015 | Lagally et al. | |
| 9,082,209 B1 | 7/2015 | Engelbart | |
| 9,214,018 B1 | 12/2015 | Engelbart | |
| 9,429,935 B2 | 8/2016 | Boyl-Davis et al. | |
| 9,586,367 B2 | 3/2017 | Drewett et al. | |
| 9,595,096 B2 | 3/2017 | Dorris et al. | |
| 9,645,095 B2 | 5/2017 | Engelbart et al. | |
| 10,108,766 B2* | 10/2018 | Druckman | G06F 30/23 |
| 10,139,808 B2 | 11/2018 | Engelbart et al. | |
| 10,371,506 B2* | 8/2019 | Chang | G01B 11/245 |
| 2008/0141777 A1 | 6/2008 | Engelbart et al. | |
| 2009/0100791 A1 | 4/2009 | Kayani et al. | |
| 2012/0316666 A1 | 12/2012 | Boyl-Davis et al. | |
| 2015/0254835 A1 | 9/2015 | Dorris et al. | |
| 2015/0273760 A1 | 10/2015 | Engelbart | |
| 2015/0276376 A1 | 10/2015 | Lagally et al. | |
| 2016/0097728 A1 | 4/2016 | Engelbart et al. | |
| 2017/0138385 A1 | 5/2017 | Clark et al. | |
| 2018/0067476 A1 | 3/2018 | Engelbart et al. | |
| 2020/0192331 A1 | 6/2020 | Engelbart et al. | |

OTHER PUBLICATIONS

European Patent Office, Extended European Search Report regarding European Patent Application No. 17189438.9-1224, dated Jan. 24, 2018, 10 pages.

U.S. Patent and Trademark Office, Notice of Allowance regarding U.S. Appl. No. 15/258,271, dated Mar. 29, 2018, 11 pages.

U.S. Patent and Trademark Office, Non-Final Office Action regarding U.S. Appl. No. 16/221,278, dated Apr. 1, 2020, 17 pages.

European Patent Office, Extended European Search Report regarding European Patent Application No. 19204647.2, dated Apr. 15, 2020, 8 pages.

* cited by examiner

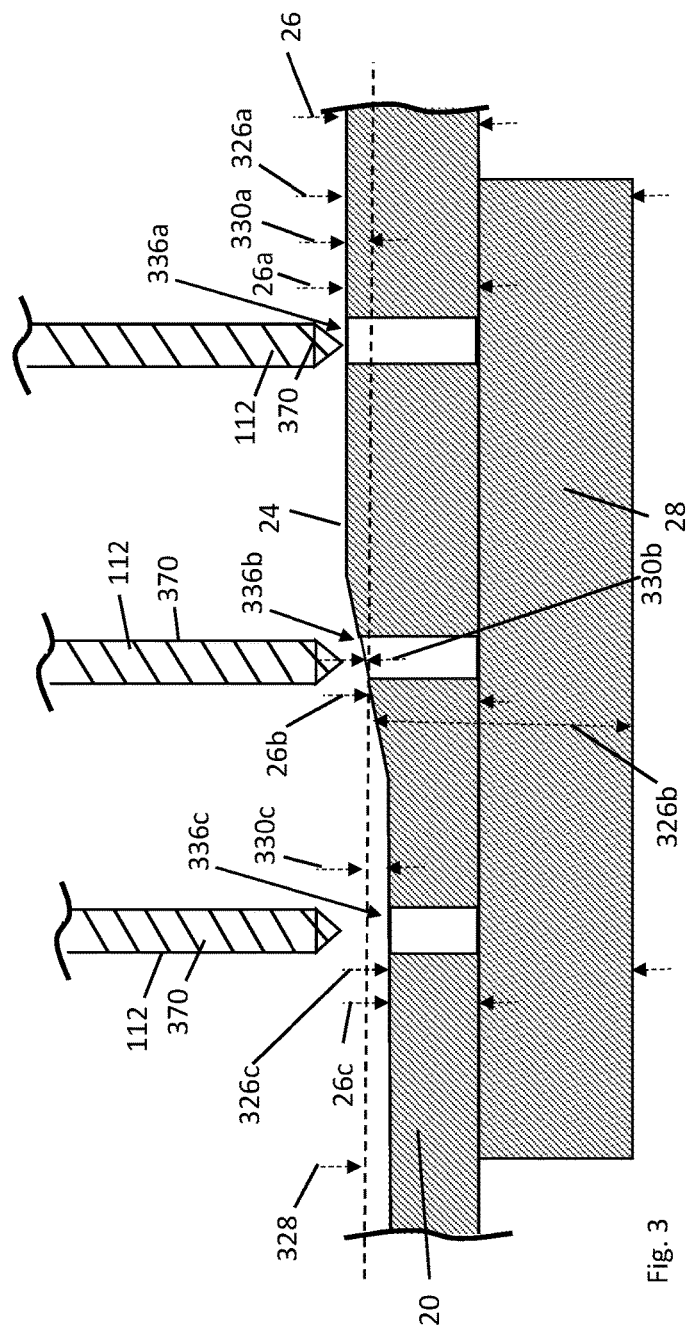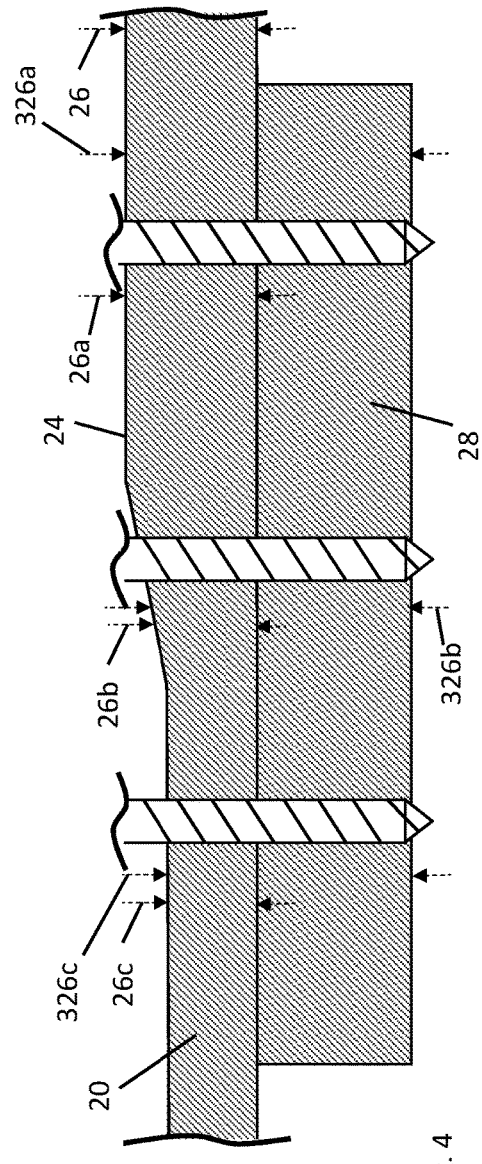
Fig. 3
Fig. 4

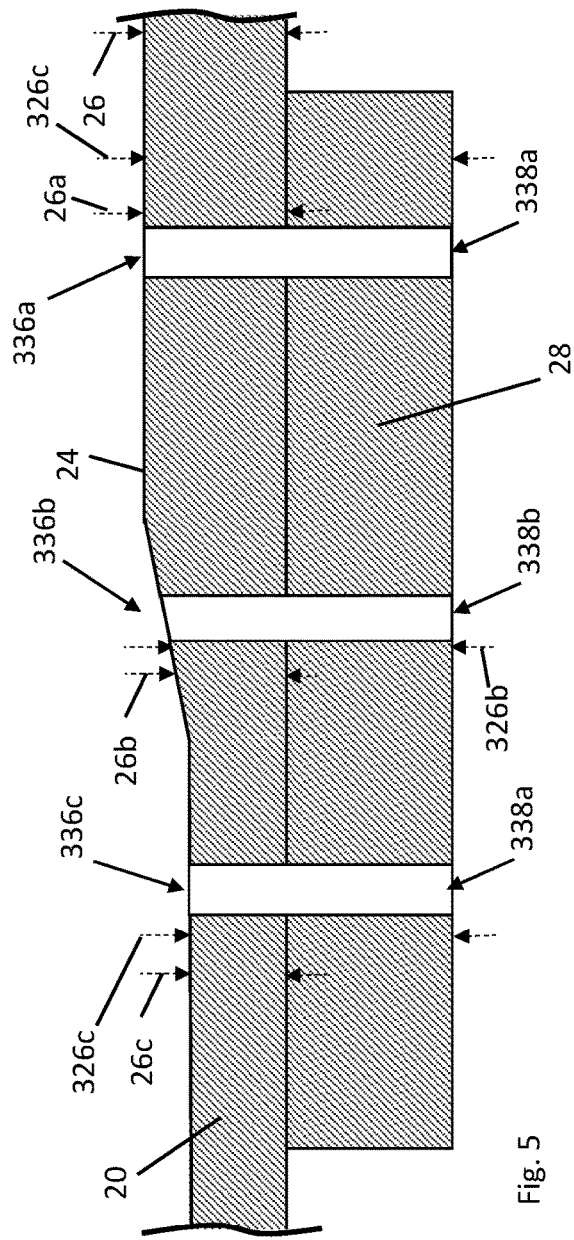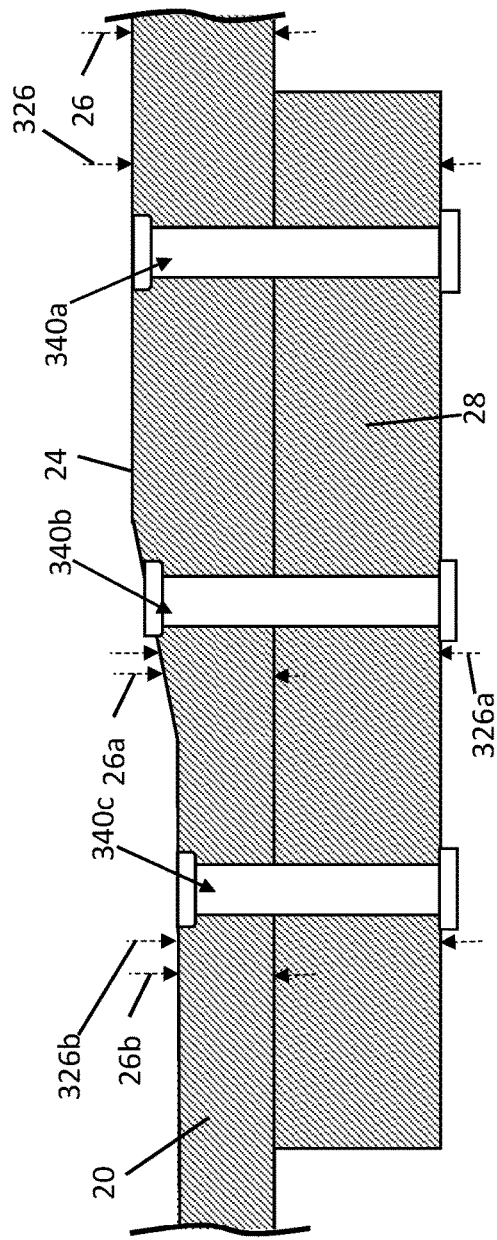
Fig. 5
Fig. 6

PREDICTIVE PREPARATION OF MATERIAL FOR JOINT ASSEMBLY

FIELD

This disclosure relates to techniques for gathering and using data from nondestructive inspection of parts for use in assembling the parts. More specifically, the disclosed embodiments relate to systems and methods for using the data to determine a set of parameters for preparation of fastener holes in the parts and for preparing the holes using the parameters.

INTRODUCTION

Parts may be manufactured for assembly from composite materials or metallic materials and either of these types of parts may be subjected to nondestructive inspection prior to assembly. Nondestructive inspection methods include the use of ultrasonics, eddy current, x-ray, magnetic resonance, optical imaging, and microwave.

Typically, the nondestructive inspection is performed to characterize qualities of the parts. For example, a part made of a composite material, such as carbon-fiber-reinforced polymer, may have anomalies the extent and effect of which may be characterized by nondestructive inspection. Parts may also include a degree of porosity that may be measured and located. Nondestructive inspection, such as ultrasound inspection, will typically gather data about the part in the course of detecting and locating such characteristics.

Proper assembly of parts, for example mounting an aerodynamic (or aero) surface or skin to a substructure, such as a spar or rib, requires fitting the two parts together at their mating surfaces, then preparing fastener holes through the two parts and selecting for each hole a fastener with the proper length. If either or both of the parts have a thickness greater or less than expected, and/or a gap between the mating surfaces, the actual length of the hole through each part and the proper length of each fastener will be different from what was expected.

An automated machine may be used for preparing fastener holes, which may include a capability of holding the two parts together and measuring a total thickness of the two parts at each location for a fastener hole. Such machine may measure the total thickness of the parts by calculating the total distance between the two tools that hold the parts. However, such a method does not provide any information about the individual thickness of each of the parts. Additionally, the method may not perform adequately in areas where one or both of the parts has a relatively abrupt variation in thickness.

An example of a part with relatively abrupt change in thickness is a fuselage skin part for installation at a window or door frame. Such part may be designed with additional thickness (known as "pad-up") in the area of the frame for strength and less thickness away from the frame to reduce weight. For example a fuselage skin part may be formed of a composite material that is made up of several plies of material, including additional plies in a pad-up area at the window or door frame. The part may have fewer plies in the area away from the frame. In a transition area, known as a ply drop, between the additional plies and the fewer plies, the part may change in thickness relatively abruptly. Near the ply drop, obtaining an accurate measure of total thickness is difficult. If the actual or as-built thickness of the two parts is different from the expected thickness, then ensuring proper selection of the length of fastener may be more challenging.

As another example, a skin made of a composite material and a substructure part made of aluminum or titanium may be joined together for preparation of a fastener hole. A cutting tool, such as a drill, may be used to prepare the hole through the parts. The optimized drilling parameters are often different for the dissimilar materials. Typically, the method of drilling the hole through the two parts involves setting up the tool with drilling parameters appropriate to the first material to be drilled and the thickness of the first material. The tool will then drill through the first material to the expected thickness. Then, typically, the tool fully retracts the drill before switching to the parameters appropriate to the second material. Then the tool drills through the second material using its parameters and the expected thickness. It can be appreciated that reliable drilling through both of the dissimilar materials may be impacted if the actual or as-built thickness is different than the expected thickness.

Accordingly, there is a need for a method and a system for making use of information obtained from nondestructive inspection of actual or as-built parts in combination with digital models of the parts for determining the proper drilling and other parameters for preparing fastener holes. Additionally, there is a need for a method and a system for selecting proper fastener lengths for the holes.

SUMMARY

The present disclosure provides methods and systems for determining a set of parameters for preparing a skin for assembly to a substructure. In one or more embodiments, a method may include a step of nondestructively inspecting the skin at a plurality of locations of at least one of the inner and outer surfaces to gather a data set relating to the skin thickness. The method may further include a step of calculating, using the data set, a set of as-built thickness values for the skin for at least a portion of the plurality of locations. The method may further include a step of determining a mating area of the inner surface of the skin with the mating surface of the substructure. The method may further include a step of determining a set of locations for fastener holes through the skin and the substructure in the mating area. The method may further include a step of generating a set of parameters for the set of locations for fastener holes by calculating, for the set of locations for fastener holes, a set of deviations of the as-built thickness values from the nominal map of the skin thickness. The method may further include a step of determining, using the set of deviations of the as-built thickness values from the nominal map of the skin thickness, a set of fastener lengths for the set of locations for the fastener holes. The method may further include a step of cutting the fastener holes through the skin and the substructure. The method may further include a step of selecting a set of fasteners using the set of fastener lengths. The method may further include a step of installing the set of fasteners at the set of locations for the fastener holes.

In one or more embodiments, a method for refining a set of drilling parameters used by a numerically-controlled machine to prepare a skin and a substructure for a joint assembly may include a step of nondestructively inspecting the skin at a plurality of locations of at least one of the inner and outer surfaces of the skin to gather a data set relating to the skin thickness. The method may further include a step of calculating, using the data set, a set of as-built thickness values for the skin for at least a portion of the plurality of locations. The method may further include a step of calculating, for the set of locations for fastener holes, a set of deviations of the as-built thickness values from the nominal map of the skin thickness. The method may further include a step of providing to the numerically-controlled machine the set of deviations of the as-built thickness values from the nominal map of the skin thickness. The method may further include a step of the numerically-controlled machine drilling a set of fastener holes through the skin using the set of deviations of the as-built thickness values from the nominal map of the skin thickness. The method may further include a step of drilling a set of fastener holes through the skin and the substructure. The method may further include a step of determining, using the set of deviations of the as-built thickness values from the nominal map of the skin thickness, a set of fastener lengths for the set of locations for the fastener holes. The method may further include a step of selecting a set of fasteners using the set of fastener lengths. The method may further include a step of installing the set of fasteners at the set of locations for the fastener holes.

One or more embodiments of the present disclosure may include a system for cutting a set of fastener holes in a skin and a substructure using a numerically-controlled machine and a nondestructive inspection system. The system may include a computer coupled to the nondestructive inspection system and configured to receive from the nondestructive inspection system a data set relating to the skin and further configured to store a nominal map of the skin thickness. The system may further include in the computer a processing element configured to calculate, from the data set relating to the skin, an as-built thickness profile for at least a portion of the skin. The system may further include that the computer is coupled to the numerically-controlled machine and provides to the numerically-controlled machine a set of deviations, at a set of locations for fastener holes, of the as-built thickness profile of the skin from the nominal map of the skin thickness. The system may further include a visualization tool coupled to the computer and configured to aid in identifying the set of deviations, at the set of locations for the fastener holes, of the as-built thickness profile of the skin from the nominal map of the skin thickness. The system may further include that the computer records in a database the set of deviations of the as-built thickness profile of the skin from the nominal map of the skin thickness for use in subsequent production of another skin. The system may further include that the computer is configured to provide to the numerically-controlled machine an update to the nominal set of fastener lengths, based on the set of deviations, at the set of locations for the fastener holes, of the as-built thickness profile of the skin from the nominal map of the skin thickness.

Features, functions, and advantages may be achieved independently in various embodiments of the present disclosure, or may be combined in yet other embodiments, further details of which can be seen with reference to the following description and drawings.

BRIEF DESCRIPTION OF THE DRAWINGS

FIG. 3 is a cross-sectional view of the skin and substructure as in FIG. 2 with the drilling tool retracted and showing the holes cut through the skin only despite the varying thickness of the skin.

FIG. 4 is a cross-sectional view of the skin and substructure as in FIG. 2 with the drilling tool according to the present disclosure cutting holes through the substructure after cutting through the skin.

FIG. 5 is a cross-sectional view of the skin and substructure as in FIG. 4 with the drilling tool removed and showing the holes cut through the substructure and the skin.

FIG. 6 is a cross-sectional view of the skin and substructure as in FIG. 5 with a fastener of proper length attached in each of the holes.

DESCRIPTION

Figure 1:
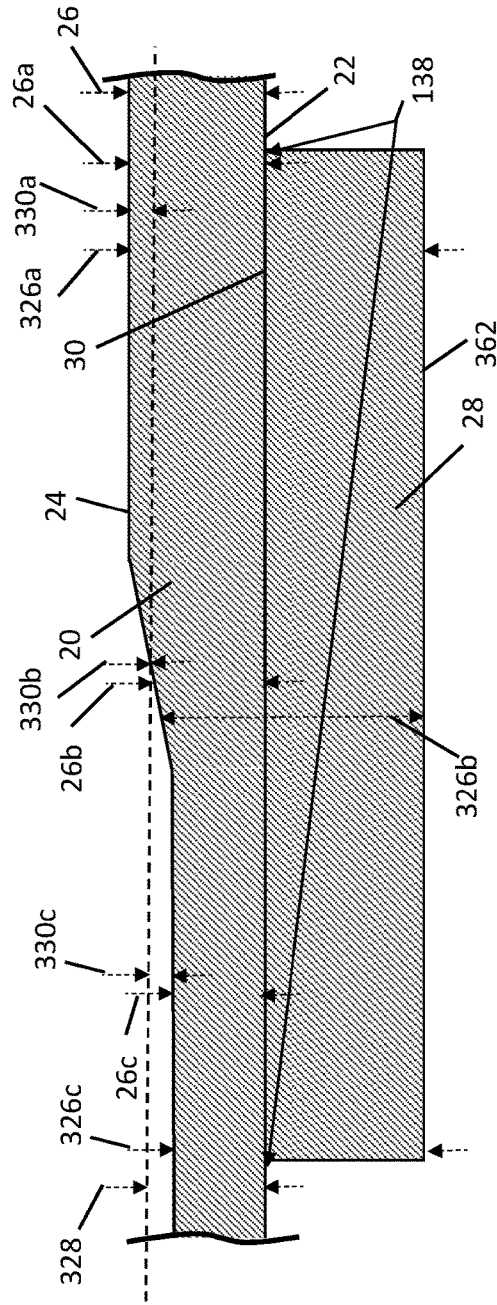
FIG. 1 is a cross-sectional view of a skin mating with a substructure, showing a set of deviations in the thickness profile of the skin and a set of deviations of the combined thickness of the skin and substructure.

Various embodiments of methods and systems for inspecting materials for assembly and predicting adjustments to the parameters for preparing the materials using data from nondestructive inspection are described below and illustrated in the associated drawings. Unless otherwise specified, the methods and systems and/or their various constituent pieces may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other similar embodiments, such as those for preparing and assembling the materials using the nondestructive inspection data. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Embodiments of the present disclosure may improve and streamline the preparation of material for assembly, such as the assembly of a skin to a substructure. Embodiments of the present disclosure are directed to automating the data collection process to determine adjustments to material preparation, for example, adjustments to the predicted depth and other parameters of fastener holes through the materials and may automatically deliver all required data to automated systems for preparing the fastener holes. Embodiments of the present disclosure may allow material-preparation requirements to be established and to select and/or adjust a pre-determined selection of fastener lengths in advance of assembly operations. The expected result is effectively to remove significant labor cost and cycle time from critical path assembly operations. Embodiments of the present disclosure may provide for automated statistical process control (SPC) data collection and analysis to support process capability determination for improved efficiency and quality, and more repeatable processes. Embodiments of the present disclosure may provide for determination of material-preparation parameters and selection of appropriate fastener lengths, particularly where data analytics demonstrate a repeatability that can be mitigated through changes to design and manufacturing processes. Embodiments of the present disclosure may support Full Size to Full Size Determinate Assembly and Precision Assembly (FSDA/PA), which may allow detail parts, substructure, and skins to be fabricated complete with all holes incorporated in the final designed condition. This in turn may allow assembly to occur without the performance of drilling operations on assembly, further eliminating significant labor cost and cycle time from assembly operations, reducing nonconformances, and eliminating a major source of workplace recordable injuries and lost work days. Embodiments of the present disclosure have the potential to eliminate one or more temporary assembly operations, with a substantial cost savings.

FIG. 1 illustrates two components or parts aligned for assembly. A first component or part, such as an aero-surface or skin 20, defines an inner surface 22 and an outer surface 24. Typically, inner surface 22 and outer surface 24 are substantially parallel to one another. Skin 20 defines a thickness 26 between surfaces 22 and 24, which may vary in value over the surface area, as shown as examples at 26a, 26b, and 26c. Thickness 26 is defined in a direction that is perpendicular to at least one of the surfaces, and, in cases where the surfaces are substantially parallel, perpendicular to both surfaces. An as-built thickness dimension or profile 26a-c of skin 20 may deviate in an area from a designed thickness profile 328. Deviations 330a-c may vary over the area. The cross-sectional view of FIG. 1 shows the set of deviations 330a-c of the as-built thickness profile 26a-c from the designed thickness profile 328 along a first dimension, and the set of deviations will also be distributed along a second dimension.

Skin 20 is being aligned in FIG. 1 with a second part, such as a substructure 28, which may, e.g., be a structural spar or rib. Substructure 28 includes an upper mating surface 30. Inner surface 22 of skin 20 may be received on upper mating surface 30 of substructure 28, defining a mating area 138. Skin 20 is being prepared for assembly to substructure 28, which may include being fastened to substructure 28, for example by a set of fasteners, such as rivets. Installation of such fasteners may require the pre-drilling of a set of holes through the skin and the substructure.

Figure 2:
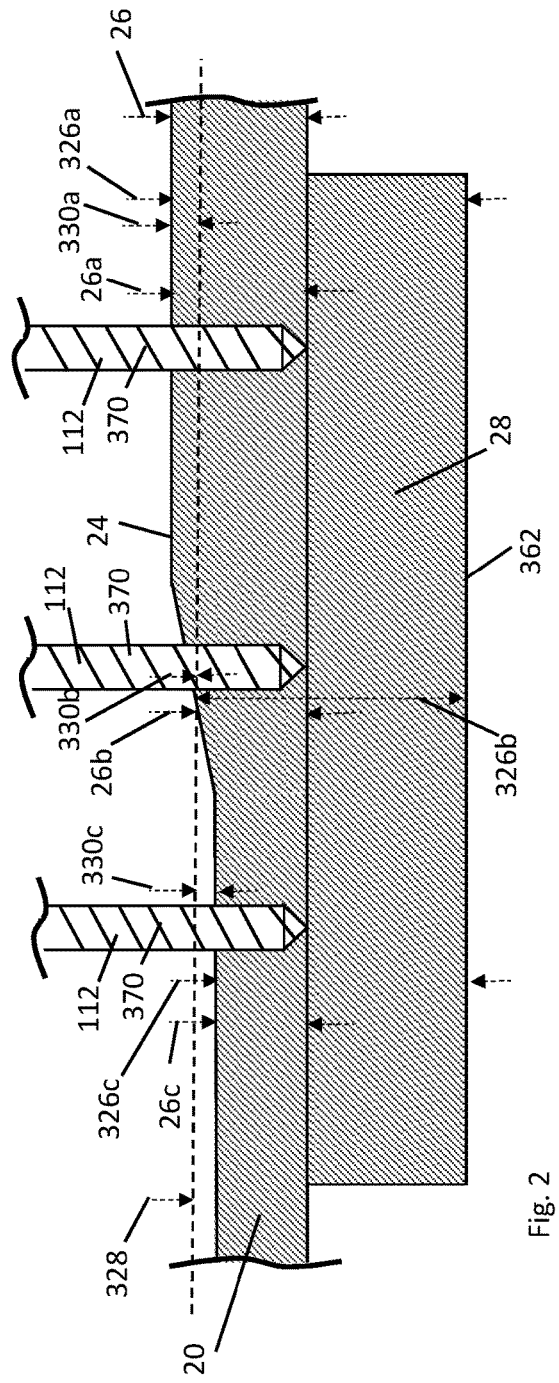
FIG. 2 is a cross-sectional view of the skin and substructure of FIG. 1 with a drilling tool according to the present disclosure cutting holes through the skin only.

As shown in FIG. 2, a method for drilling fastener holes uses a drilling tool 360 that can cut holes through the skin. Such a tool may be coupled to a pair of holders (not shown) or other device(s) capable of measuring the distances 326a-c of the stack-up of the skin and substructure, i.e., the distance between outer surface 24 of skin 20 and a lower surface 362 of substructure 28. Typically, for dissimilar materials of skin 20 and substructure 28, a first set of parameters, such as the speed and feed rate, are provided to tool 362 appropriate to the skin material and the tool cuts the hole in skin 20. Then the tool may be retracted (FIG. 3) or may remain in the hole. In either case, a second set of parameters may be provided to the tool appropriate to the substructure material.

If the tool measures only the stack-up of the skin and the substructure, and uses a designed thickness profile 328 for skin 20 without considering adjusting for as-built thickness, e.g., by use of nondestructive inspection data, the holes may not be properly cut. The holes intended to go through the skin may end before cutting all the way through the skin, if the skin is thicker than expected. If the skin is thinner than expected, the holes may extend into the substructure. In either of these cases, reliable drilling through both of the dissimilar materials may be impacted.

Figure 7:
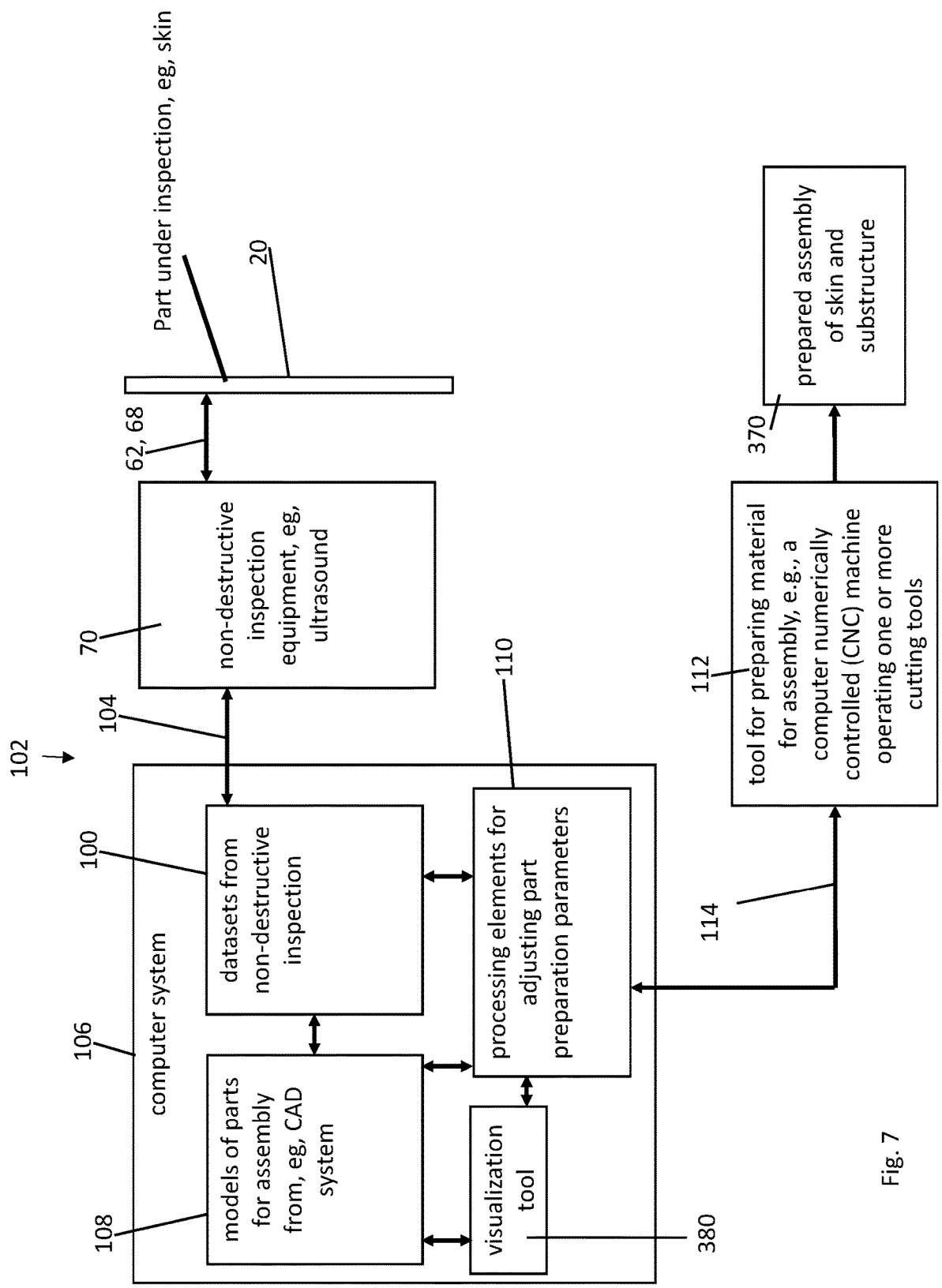
FIG. 7 is a block diagram of a system for measuring thickness, calculating thickness deviations, predicting appropriate parameters for part preparation, and preparing parts for assembly according to an embodiment of the present disclosure, including a computer system storing models of parts or components, such as the aero-surface and substructure of FIGS. 2-6, and datasets relating to parts or components that have undergone nondestructive inspection, a nondestructive inspection system, such as the ultrasound equipment of FIG. 8, 9 or 10, and part preparation tool, such as a computer numerically controlled (CNC) machine with one or more cutting tools.

FIGS. 2-6 depict the operation of one or more embodiments of the present disclosure. FIG. 7 depicts a system 102 for carrying out such operations. In FIG. 2, a tool 112, such as a computer numerically controlled (CNC) machine with a cutting implement, such as drill bit 370, has information about the as-built thickness profile 26a-c of skin 20 and may additionally have information about the designed thickness profile 328 and deviations 330a-c from profile 328. Tool 112 may receive such information from computer 106 (FIG. 7), which may be coupled to and/or integrated with a nondestructive inspection system, e.g., an ultrasound system 70, which will be described in greater detail in relation to FIGS. 8-10 below.

Additionally, tool 112 may be capable of measuring the combined thicknesses 326a-c of skin 20 and substructure 28. For example, tool 112 will typically have a fixture, clamp, holding device at surface 362 of substructure 28 and another holding device at surface 24 of skin 20 to hold the parts in alignment for the drilling operation. Tool 112 typically also includes a means to measure the separation of these holding devices, which should be equal to the combined thicknesses 326a-c of skin 20 and substructure 28. The measurement based on the holding devices of tool 112, which does not include information about the individual as-built thicknesses of each of the skin and substructure, may be combined with the as-built thickness information from the non-destructive inspection system. With this information, tool 112 controls cutting tool 370 to cut a set of fastener holes through skin 20 and substructure 28. For convenience, drill bit 370 is depicted three times in FIGS. 2 and 3, and in practice, a single drill bit may be used and moved serially from one hole to another and/or more than one drill bits may be used.

As shown in FIGS. 2 and 3, tool 112 is capable of cutting a set of one or more holes 336a-c through skin 20 using a first set of parameters, e.g., the feed and speed of the drill bit, appropriate to skin 20 and ending each cut at lower surface 22 of skin 20. Tool 112 may use the as-built thickness profile 26a-c of skin 20 and other information to determine where to end the cutting of skin 20. Typically, each of holes 336a-c extends to lower surface 22 and does not extend into substructure 28. If substructure 28 is made of a dissimilar material or if for other reasons another set of parameters is appropriate for preparing holes through substructure 28, then drill bit 370 may be stopped at the interface between the skin and the substructure. Drill bit 370 may be withdrawn from the hole through the skin as depicted in FIG. 3 or may remain in the hole as suited to the particular situation.

As seen in FIGS. 5 and 6, tool 112 may then prepare substructure 28, e.g., by cutting a set of holes through substructure 28 using a set of parameters appropriate to the material of substructure 28. Tool 112 may provide information back to computer 106 (FIG. 7) about the tool's measurement of the depth of holes 336a-c through the skin 20, holes through the substructure, and/or holes 338a-c through both parts that tool 112 has cut.

As seen in FIG. 6, a set of fasteners 340a-c such as rivets or bolts may be installed in the through-holes of the skin and substructure and fastened in place to secure the skin and substructure together and the length of each fastener may be matched to the length of holes 338a-c. Fasteners 340a-c may be selected using one or more of the sets of information about the thickness of the parts, such as the as-built thickness profile 26a-c of the skin, the designed skin thickness profile 328 of the skin, the designed and as-built thickness of the substructure, the calculated stack-up thicknesses, and/or the as-assembled stack-up thicknesses.

As seen in FIGS. 7-10, system 102 may include nondestructive inspection system, such as ultrasound system 70, which may be coupled to or integrated with computer 106. Ultrasound system 70 may be used to inspect any part and gather information about the internal structure and the thickness of the part. Ultrasound system 70 is depicted in FIGS. 7-10 performing inspection on skin 20 and may also be used for inspection on substructure 28 or other part.

Figure 8:
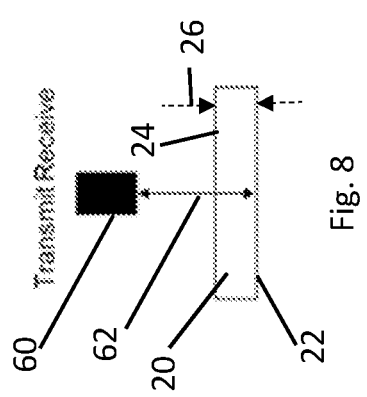
FIG. 8 is a schematic view of an ultrasound system for nondestructive inspection of a part, showing an ultrasound transmitter and receiver positioned on the same side of the part, for probing the part by pulse-echo analysis.
Figure 9:
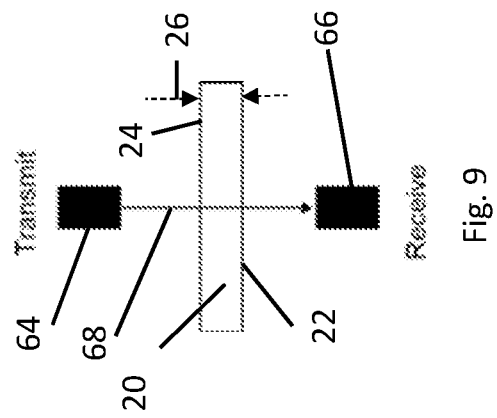
FIG. 9 is a schematic view of an ultrasound system for nondestructive inspection of a part, showing an ultrasound transmitter on one side of the part and an ultrasound receiver on an opposite side of the part, for probing the part by through-transmission of ultrasound.

As noted above, nondestructive inspection to characterize part qualities, such as checking porosity and for delaminations, may be required and carried out for parts prior to assembly. Ultrasound analysis is an example of nondestructive inspection. An ultrasound system may use pulse-echo or through-transmission techniques to gather data in such inspection. Typically for pulse-echo, an arm of the inspection system has, as shown in FIG. 8, an end effector 60 holding a water nozzle and an ultrasonic transducer that combines transmit and receive functions. End effector 60 may be moved over a surface of the part being inspected, and/or the part itself may be moved. The water nozzle provides a stream of water which carries an ultrasound signal 62 from the transducer into part 20. The ultrasound enters part 20 at either surface, e.g., surface 24 and travels through part 20, and bounces off the opposite surface, e.g., surface 22 of the part and returns to the sending transducer. Similarly, as shown in FIG. 9, a through-transmission ultrasound system may include a pair of end effectors 64, 66, one responsible for transmitting an ultrasound signal 68 and the other receiving it. Typically, each end effector is positioned to transmit and/or receive the ultrasound in a direction that is perpendicular to at least one of the surfaces, and, in the case of the surfaces being substantially parallel, perpendicular to both surfaces.

Typically, the velocity of sound in the material under inspection is known, as well as the spacing of each transmitter/receiver from the adjacent part surface. The ultrasound system is able to measure the time it takes for the ultrasonic signal to travel through the part, for example by gating an A-scan trace. The system typically makes and records each measurement for a location, defined by a coordinate pair in two horizontal dimensions, and this location is the same on both part surfaces. From this data, the ultrasound system or a connected computer may calculate the material thickness (rate×time=distance) at each location to which the system moves the end effector(s). For example, the inspection may involve a series of scan passes, where each scan pass produces a line of ultrasonic data. The series of scan passes may be built into a full picture of the part's thickness values at a set of locations over a 2-dimensional area of the part.

Figure 10:
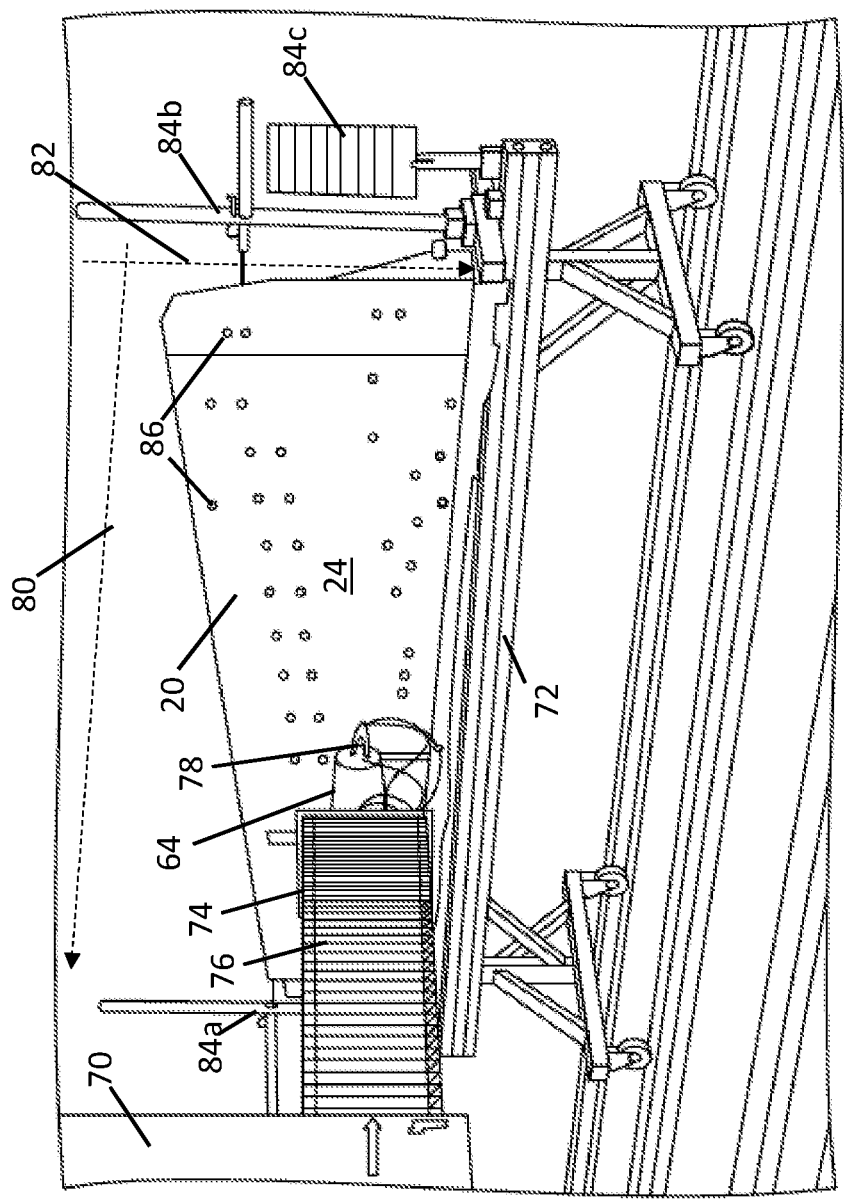
FIG. 10 is a perspective view of an ultrasound inspection system, showing an aero-surface or skin, in particular an aircraft flap, as the part under inspection, mounted on a gantry for movement in relation to the inspection, and also showing an extendable arm with an accordion enclosure and an end effector that includes a water nozzle and an ultrasound transducer for inspection of the part, representing either a pulse-echo system, or, in combination with a corresponding arm (not visible) behind the part under inspection, a through-transmission system.

An example of an ultrasound inspection system 70 is shown in FIG. 10 where part 20, in this case an aircraft flap, is mounted on a gantry 72, allowing movement in relation to the inspection. An arm 74 may be movable in up-and-down and left-right dimensions, and may include an accordion enclosure 76 facilitating extension of arm 74 closer to, and farther from surface 24 of part 20. End effector 64 may include a water nozzle 78 to provide a stream of water to surface 24 (or surface 22). End effector 64 may include an ultrasound transmitter for providing the ultrasound signal via the stream water for inspection of the part. In a through-transmission system, end effector 66 with an ultrasound receiver may be mounted on an arm (not visible behind the part under inspection in FIG. 10) corresponding to arm 74. Alternatively, arm 74 may mount an ultrasound transducer for inspection of the part by pulse-echo analysis.

As can be seen in FIGS. 8-10, the ultrasound inspection system allows for nondestructively inspecting part 20 to gather a data set 100 (see FIG. 7) relating to part 20. Data set 100 may include information about the as-built structure of part 20 in two horizontal dimensions 80, 82, such as soundwave travel times, relating to a thickness dimension. The thickness dimension typically is defined as orthogonal to horizontal dimensions 80, 82. The soundwave travel times and related information (such as material density and structure or other information relating to the speed of sound in the material) may be used to calculate a set of thickness values for the as-built structure of part 20. Each thickness value may be defined at a location, e.g., a pair of coordinates in horizontal dimensions 80, 82 of part 20.

As further seen in FIG. 10, gantry 72 of the inspection system may include various positioning and alignment tools 84a-c to aid in relating the inspection's measurements to the as-built structure. The part's as-built structure may also include one or more alignment indicators 86, each of which may be a mark for alignment and/or for future location of an assembly hole, or may be a pre-formed (in original construction or pre-drilled) assembly hole. Typically, alignment indicators 86 are placed at known, measured locations on the part corresponding to locations established for the design of the part. The inspection system may use one or more of the alignment indicators in relating measurements of the as-built structure to the design of the part.

Returning to FIG. 7, system 102 for inspecting part 20 and predicting parameters for preparation of part 20 and another part to which part 20 will be assembled. Nondestructive inspection equipment, such as ultrasound system 70 may be configured to communicate data 104 from the ultrasound measurements to computer system 106. FIG. 7 depicts computer system 106 as separate from ultrasound system 70 and alternatively one or more portions or the whole of the computer system may be built-in to ultrasound system 70. Other division of the processing of data from inspection and the predicting of parameters for preparing parts may be implemented as best suited to particular applications of embodiments of the present disclosure.

Computer system 106 may store one or more data sets 100 from the nondestructive inspection of skin 20. For example, system 102 may be configured for computer 106 to record in a database the set of deviations 330*a-c* of as-built thickness profile 26*a-c* of skin 20 from nominal map 328 of the skin thickness for use in subsequent production of another skin. Computer system 106 may also store digital models 108 of parts, such as skin 20 and substructure 28. Models 108 may be sourced from a separate CAD system used to design skin 20 and/or substructure 28, or from another source, or computer system 106 may incorporate the CAD system used to design such parts.

A digital model 108 for a part, such as skin 20, may include a digital model that includes a nominal map for the skin in two horizontal dimensions and in a thickness dimension. A digital model 108 for a part, such as substructure 28 may include a nominal map for the substructure in two horizontal dimensions and in a thickness or height dimension. Computer system 106 may include one or more processing elements 110 that may make use of the digital models and the data sets from nondestructive inspection for predicting the parameters for preparing parts 20 and 28 for assembly. Further details on the digital models, the inspection data sets, and the processing of data for part preparation will be discussed in relation to FIGS. 11-12 below.

As further shown in FIG. 7, computer system 106 may include processing elements 110 for providing and/or adjusting part preparation parameters 114. Computer system 106 may be in communication with equipment, such as a tool 112 for preparing material for assembly, e.g., a computer numerically controlled machine operating one or more cutting tools. For example, computer system 106 may generate part preparation parameters 114 for skin 20 that includes an as-built thickness profile 26*a-c* and/or a set of deviations 330*a-c* from a designed thickness profile 328 for one or both of the parts being assembled. Profile 26*a-c* may include a set of horizontal coordinate pairs and thickness values for skin 20. Generally, such thickness values will correspond to deviations 330*a-c* of the as-built thickness values of the skin from designed profile 328 of the skin. Computer 106 and/or tool 112 may relate the thickness profile and/or the deviations from the nominal map of skin thickness to a set of locations for fastener holes 338*a-c* and prepare the fastener holes accordingly.

Figure 12:
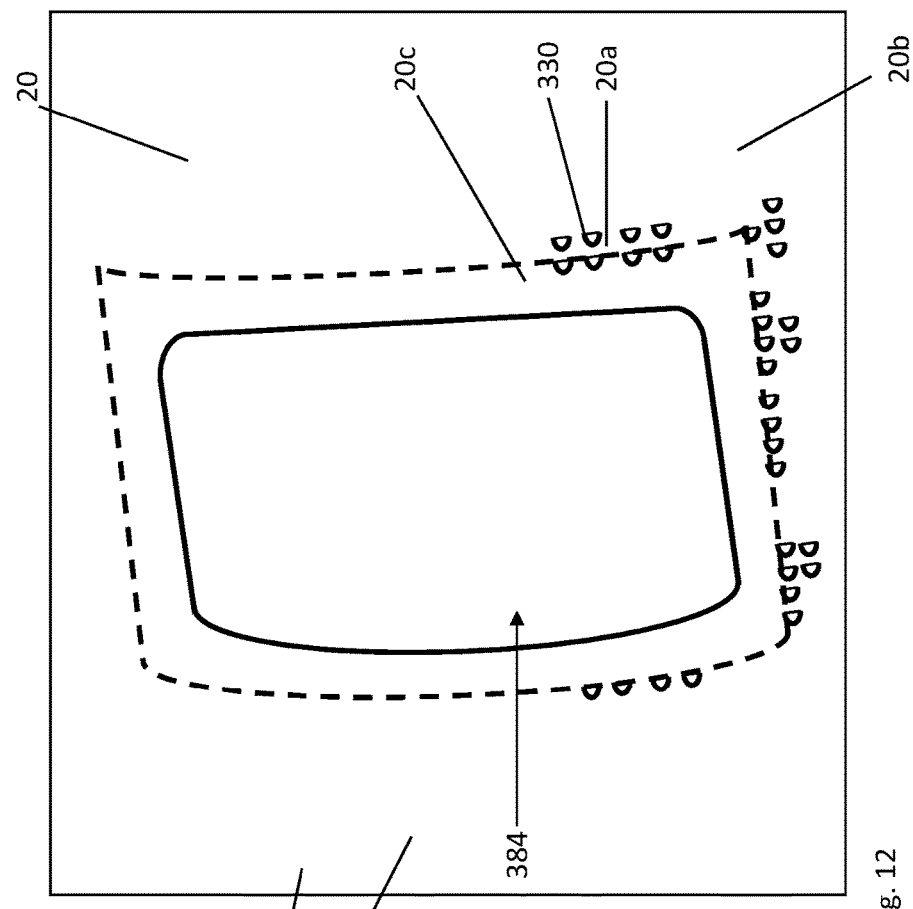
FIG. 12 is a magnified perspective view of the section of fuselage skin in FIG. 11, and showing in greater detail the areas of ply drop in the fuselage skin adjacent the pad-up area around the door opening.
Figure 11:
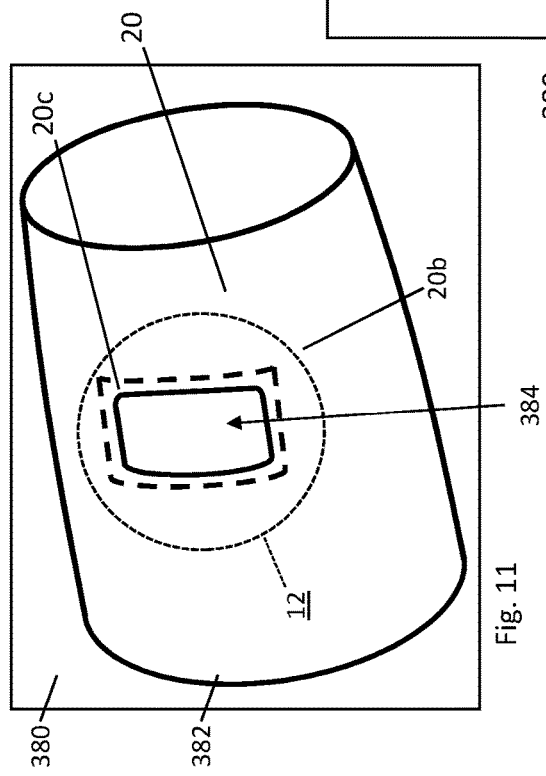
FIG. 11 is perspective view of a section of fuselage skin including a pad-up area adjacent a door opening and illustrating areas of ply drop adjacent the pad-up area around the door opening.

System 102 may further include a visualization tool 380, depicted in FIGS. 7, 11 and 12, typically coupled to, or part of, computer 106, that is configured to aid in identifying the set of deviations 330*a-c*, at the set of locations for fastener holes 340*a-c*, of the as-built thickness profile 26*a-c* of skin 20 from the nominal map 328 of the skin thickness. Visualization tool 380 may produce an image 382 of one or more parts being evaluated for assembly using designed and as-built information about the parts. Image 382 is typically in three dimensions. In FIG. 11 and magnified in FIG. 12, image 382 depicts skin 20, in this case part of a fuselage assembly, including an opening 384 for a door. Skin 20 includes a deviation 330 in as-built thickness, in this case occurring around a transition in skin thickness 20*a* from a non-padded area 20*b* to a pad-up area 20*c*, the pad-up area 20*c* being where additional plies are locally added to the skin 20 to create a thicker portion suitable for coupling to the frame adjacent a door. Such pad-up areas 20*c* and the adjacent transition areas 20*a* may be particular areas of concern for potential deviations from the designed thickness profile 328 of skin 20. Visualization tool 380 may allow an operator to specify such locations for adjustment of the parameters for preparation of fastener holes in skin 20 and substructure 28.

Figure 13:
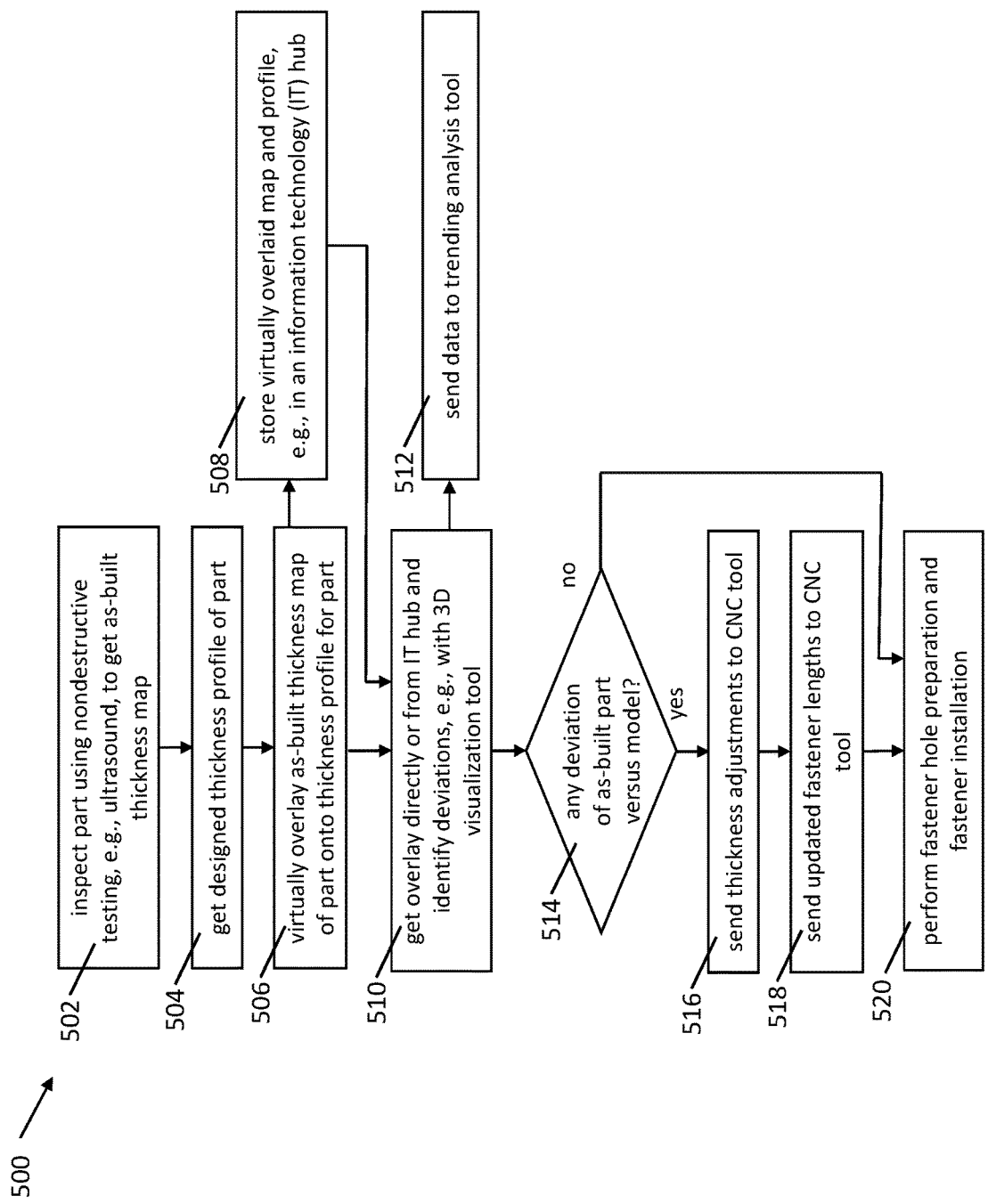
FIG. 13 is an illustration of operations performed in one or more embodiments of the present disclosure, showing the steps of nondestructive inspection of a part, storing and comparing data obtained in the inspection, and adjusting the parameters for preparing fastener holes and the fastener lengths for the holes.

As depicted in FIG. 13, a method 500 according to the present disclosure may include a step 502 of nondestructively inspecting a part at a plurality of locations to gather a data set relating to the part thickness and calculating from the data set a set of as-built thickness values 26*a-c* for the part for at least a portion of the plurality of locations. Either or both of the parts being joined, e.g., the skin and the substructure may be inspected for thickness. As described above, such inspection may occur at one or both of the part's inner and outer surfaces. The method may include a step 504 of getting a designed thickness profile 328 of the part, e.g., from a CAD system where a model of the part was designed (FIG. 7). The method may further include a step 506 of virtually overlaying the as-built thickness map 26*a-c* of the part onto the thickness profile 328 of the part, which overlaying may include determining mating area 138 (FIG. 1) of the part with its mating part and/or a set of locations for fastener holes through the parts within the mating area. The method may include a step 508 of storing the virtually overlaid as-built map and designed profile in a storage location, e.g., a database in an information technology (IT) hub for access by this system and/or by other systems in the manufacturing process. The method may further include a step 510 of getting the overlay directly or from IT hub so that deviations between the as-built map and the designed profile may be identified deviations, automatically and/or with the aid of a 3D visualization tool 380 (FIGS. 11-12). The method may further include a step 512 of sending data, e.g., on deviations, to a trending analysis tool, which may be useful in process control. Step 512 may include sending data on one or both of the parts being joined, e.g., the skin and the substructure.

The method may include a step 514 of determining if there are any deviations of the as-built part or parts as compared to the model. If not, the method may branch directly to a step 520 of performing fastener hole preparation and fastener installation. If one or more deviations are present, then the method may include a step 516 of sending one or more thickness adjustments to the machine that is preparing the fastener holes. For example, in the case of joining two parts of dissimilar materials using a CNC tool, the tool has a set of drilling parameters for each of the materials and an expected thickness of each of the materials. The method at step 516 provides for sending to the CNC tool an adjustment of the thickness of the first part to be drilled so that the CNC tool at step 520 can cut the hole through the first part accurately, and stop at the mating surfaces between the parts. Then the tool may switch to the drilling parameters appropriate to the material of the second part and cut the hole through the second part. The method may further include a step 518 of sending an update to the nominal set of fastener lengths to the CNC tool.

Fasteners are typically manufactured in a set of discrete lengths, sometimes referred to as bins. The step of sending an update to the nominal set of fastener lengths may include changing the fastener length at any given location to a different bin. The method may include a limitation on the updating of fastener length to not changing by more than one bin, i.e., only changing to the next higher or lower available length of fastener.

As noted above, the method may include a step 520 of performing fastener hole preparation and fastener installation, which occurs either directly after a determination of no deviations, or after the steps of adjusting thickness parameters and fastener lengths.

Aspects of one or more embodiments of the present disclosure for a system and method for predictive preparation of parts for joining may be embodied as a computer method, computer system, or computer program product. Accordingly, aspects of one or more embodiments of the present disclosure for a system and method for predictive preparation of materials and/or selection of fastener lengths may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of one or more embodiments of the present disclosure for a system and method for predictive preparation of materials and/or selection of fastener lengths may take the form of a computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a computer-readable storage medium may include any suitable tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, radio frequency (RF), and/or the like, and/or any suitable combination of these.

Computer program code for carrying out operations for aspects of the one or more embodiments of the present disclosure for a system and method for predictive preparation of materials and/or selection of fastener lengths may be written in one or any combination of programming languages, including an object-oriented programming language such as Java, Smalltalk, C++, and/or the like, and conventional procedural programming languages, such as the C programming language. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), and/or the connection may be made to an external computer (for example, through the Internet using an Internet Service Provider).

Aspects of one or more embodiments of the present disclosure for a system and method for predictive preparation of materials and/or selection of fastener lengths are described above with reference to flowchart illustrations and/or block diagrams of methods, apparatuses, systems, and/or computer program products. Each block and/or combination of blocks in a flowchart and/or block diagram may be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer-readable medium that can direct a computer, other programmable data processing apparatus, and/or other device to function in a particular manner, such that the instructions stored in the computer-readable medium produce an article of manufacture including instructions which implement the function/act specified in the flowchart and/or block diagram block or blocks.

The computer program instructions can also be loaded onto a computer, other programmable data processing apparatus, and/or other device to cause a series of operational steps to be performed on the device to produce a computer-implemented process such that the instructions which execute on the computer or other programmable apparatus provide processes for implementing the functions/acts specified in the flowchart and/or block diagram block or blocks.

Any flowchart and/or block diagram in the drawings is intended to illustrate the architecture, functionality, and/or operation of possible implementations of systems, methods, and computer program products according to aspects of one or more embodiments of the present disclosure for a system and method for predictive preparation of materials and/or selection of fastener lengths. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

We claim:

1. A method for determining a set of parameters for preparing a skin for assembly to a substructure, the skin defining an inner surface, an outer surface opposite the inner surface, and a skin thickness between the inner and outer surfaces, the substructure defining a mating surface for the skin, wherein a digital model associated with the skin includes a nominal map of the skin thickness, the method comprising the steps of:
   a. nondestructively inspecting the skin at a plurality of locations of at least one of the inner and outer surfaces to gather a data set relating to the skin thickness;
   b. calculating, using the data set, a set of as-built thickness values for the skin for at least a portion of the plurality of locations;
   c. determining a mating area of the inner surface of the skin with the mating surface of the substructure;
   d. determining a set of one or more locations for fastener holes through the skin and the substructure in the mating area; and
   e. generating the set of parameters for the set of the one or more locations for fastener holes by calculating, for the set of one or more locations for fastener holes, a set of deviations of the as-built thickness values from the nominal map of the skin thickness.

2. The method of claim 1 further including a step of determining, using the set of deviations of the as-built thickness values from the nominal map of the skin thickness, a set of one or more fastener lengths for the set of one or more locations for the fastener holes.

3. The method of claim 1 further including a step of cutting one or more fastener holes through the skin and the substructure.

4. The method of claim 3 wherein the step of cutting the one or more fastener holes through the skin and the substructure, includes a step of cutting the one or more fastener holes through the skin using the set of parameters for preparing the skin for the set of the one or more locations for fastener holes.

5. The method of claim 4 wherein the step of cutting the one or more fastener holes through the skin using the set of parameters for the set of one or more locations for fastener holes further includes using a drill to cut the one or more fastener holes.

6. The method of claim 5 wherein the drill is fully retracted after cutting the one or more fastener holes through the skin.

7. The method of claim 6 further including a step, after fully retracting the drill, of drilling through the substructure using the set of parameters for preparing the substructure for the set of one or more locations for fastener holes.

8. The method of claim 3 further including a step of determining, using the set of deviations of the as-built thickness values from the nominal map of the skin thickness, a set of one or more fastener lengths for the set of one or more locations for the fastener holes.

9. The method of claim 8 further including a step of selecting a set of one or more fasteners using the set of one or more fastener lengths.

10. The method of claim 9 further including a step of installing the set of one or more fasteners at the set of one or more locations for the fastener holes.

11. A method for refining a set of drilling parameters used by a numerically-controlled machine to prepare a skin and a substructure for a joint assembly, the skin defining an inner surface, an outer surface opposite the inner surface, and a skin thickness between the inner and outer surfaces, the substructure defining a mating surface for the skin, wherein a digital model associated with the skin includes a nominal map of the skin thickness, and wherein the numerically-controlled machine includes a set of one or more locations for fastener holes, the method comprising the steps of:
   a. nondestructively inspecting the skin at a plurality of locations of at least one of the inner and outer surfaces to gather a data set relating to the skin thickness;
   b. calculating, using the data set, a set of as-built thickness values for the skin for at least a portion of the plurality of locations;
   c. calculating, for the set of one or more locations for fastener holes, a set of deviations of the as-built thickness values from the nominal map of the skin thickness; and
   d. providing to the numerically-controlled machine the set of deviations of the as-built thickness values from the nominal map of the skin thickness.

12. The method of claim 11 further including a step of drilling with the numerically-controlled machine a set of one or more fastener holes through the skin using the set of deviations of the as-built thickness values from the nominal map of the skin thickness.

13. The method of claim 11 further including a step of drilling a set of one or more fastener holes through the skin and the substructure.

14. The method of claim 13 wherein the step of cutting the one or more fastener holes through the skin and the substructure, includes a step of cutting the one or more fastener holes through the skin using the set of deviations of the as-built thickness values from the nominal map of the skin thickness.

15. The method of claim 11 further including a step of determining, using the set of deviations of the as-built thickness values from the nominal map of the skin thickness, a set of one or more fastener lengths for the set of one or more locations for the fastener holes.

16. The method of claim 15 further including a step of selecting a set of one or more fasteners using the set of one or more fastener lengths and a step of installing the set of one or more fasteners at the set of one or more locations for the fastener holes.

17. A system for cutting a set of one or more fastener holes in a skin and a substructure using a numerically-controlled machine and a nondestructive inspection system, the skin defining an inner surface, an outer surface opposite the inner surface, and a skin thickness between the inner and outer surfaces, wherein a digital model associated with the skin includes a nominal map of the skin thickness, and wherein the nondestructive inspection system is configured to inspect the skin to gather a data set relating to the skin, and wherein the numerically-controlled machine includes a set of one or more locations and drilling parameters for the set of one or more fastener holes, the system comprising:
- a computer coupled to the nondestructive inspection system and configured to receive the data set relating to the skin and to store the nominal map of the skin thickness, the computer including a processing element configured to calculate, from the data set relating to the skin, an as-built thickness profile for at least a portion of the skin, and further wherein the computer is coupled to the numerically-controlled machine and provides to the numerically-controlled machine a set of deviations, at the set of one or more locations for the fastener holes, of the as-built thickness profile of the skin from the nominal map of the skin thickness.

18. The system of claim 17 further comprising a visualization tool coupled to the computer and configured to aid in identifying the set of deviations, at the set of one or more locations for the fastener holes, of the as-built thickness profile of the skin from the nominal map of the skin thickness.

19. The system of claim 17 wherein the computer records in a database the set of deviations of the as-built thickness profile of the skin from the nominal map of the skin thickness for use in subsequent production of another skin.

20. The system of claim 17 for use with the numerically-controlled machine having a nominal set of one or more fastener lengths for the set of one or more locations for the fastener holes, and wherein the computer further is configured to provide to the numerically-controlled machine an update to the nominal set of one or more fastener lengths, based on the set of deviations, at the set of one or more locations for the fastener holes, of the as-built thickness profile of the skin from the nominal map of the skin thickness.

* * * * *